(12) United States Patent
van Tiel et al.

(10) Patent No.: US 8,106,298 B2
(45) Date of Patent: Jan. 31, 2012

(54) ELECTRICAL COMPONENT COMPRISING A HOTMELT ELEMENT, METHOD AND TOOL FOR MANUFACTURING SUCH AN ELECTRICAL COMPONENT

(75) Inventors: Gert van Tiel, Vught (NL); Jan Van Tilburg, Oss (NL)

(73) Assignee: Tyco Electronics Nederland BV, 'S-Hertogenbosch (NL)

( * ) Notice: Subject to any disclaimer, the term of this patent is extended or adjusted under 35 U.S.C. 154(b) by 0 days.

(21) Appl. No.: 12/930,191

(22) Filed: Dec. 30, 2010

(65) Prior Publication Data

US 2011/0162886 A1 Jul. 7, 2011

(30) Foreign Application Priority Data

Jan. 4, 2010 (EP) ..................................... 10075004

(51) Int. Cl.
*H02G 15/02* (2006.01)
(52) U.S. Cl. ............... 174/84 R; 174/88 R; 439/607.59; 439/76.1
(58) Field of Classification Search ................ 174/74 R, 174/78, 84 R, 88 R; 439/493, 604, 76.1, 439/494, 497, 436
See application file for complete search history.

(56) References Cited

U.S. PATENT DOCUMENTS

| | | | | |
|---|---|---|---|---|
| 4,871,319 A | * | 10/1989 | Babow | ............................ 439/77 |
| 7,798,853 B2 | * | 9/2010 | Shi et al. | .................. 439/607.58 |
| 2001/0053624 A1 | | 12/2001 | Medina | |
| 2007/0111597 A1 | | 5/2007 | Kondou | |
| 2009/0325397 A1 | | 12/2009 | Mizukami | |

OTHER PUBLICATIONS

European Patent Office, Extended European Search Report for EP 10075004.1, Jun. 9, 2010, 4 pages.

\* cited by examiner

*Primary Examiner* — William Mayo, III
(74) *Attorney, Agent, or Firm* — Baker & Daniels LLP

(57) ABSTRACT

An electrical component having at least one cable element, at least one solder joint, at least one hotmelt element and at least one substrate element, a method of manufacturing such an electrical component, and a tool for manufacturing the electrical component. The cable element is connected with the substrate element by the solder joint. The at least one solder joint is not embedded in the hotmelt element. Preferably, the solder joint is free from the hotmelt material of the hotmelt element. Wherein a flow of hotmelt material is stopped before it reaches the solder joint. A hotmelt cavity for forming the hotmelt element from hotmelt material is separated from a substrate cavity adapted to receive the substrate element by a compressible solder sealing.

8 Claims, 6 Drawing Sheets

ELECTRICAL COMPONENT COMPRISING A HOTMELT ELEMENT, METHOD AND TOOL FOR MANUFACTURING SUCH AN ELECTRICAL COMPONENT

BACKGROUND

The invention relates to an electrical component comprising at least one cable element, at least one solder joint, at least one hotmelt element and at least one substrate element, the cable element comprising at least one conducting member, the substrate element comprising at least one electric member that is electrically connected to the conducting member via the at least one solder joint.

The invention further relates to a method for manufacturing an electric component, the electric component including: at least one cable element having at least one conducting member, at least one hotmelt element, and at least one substrate element having at least one electric member; the method comprising the steps of: connecting the at least one the conducting member to the at least one substrate element by a solder joint; applying a flow of molten hotmelt material onto at least one of the cable element and the conducting member in a region adjacent to the substrate element.

Finally, the invention also relates to a tool for manufacturing at least one electric component, the tool comprising: at least one substrate cavity, the substrate cavity being adapted to receive at least partially at least one substrate element of the electric component; at least one cable cavity, the cable cavity being adapted to receive at least one cable element of the electric component; at least one hotmelt cavity, the hotmelt cavity being located between the cable cavity and the substrate cavity and being adapted to be supplied with molten hotmelt material.

An electrical component having the above features is known from the prior art, e.g. for the transmission of data at high data rates up to 1 Gbit/s (gigabits per second). The substrate element is usually a printed circuit board that comprises active or passive, electrical or electronic parts such as conductors, integrated circuits, resistors, receivers, transceivers, transistors, to name but a few. The cable element may comprise several, or one, conducting members e.g. in the form of electrically conductive leads. The electric members of the substrate element are connected to the conducting members by solder joints. The substrate element may be equipped with additional connector elements or constitute a connector such as a male or female plug.

The hotmelt element in the prior art surrounds the cable and the conducting members in the vicinity of the substrate element and extends over a large part of the substrate element including the solder joints. The function of the hotmelt element is to provide an additional, force-absorbing connection between the cable element and the substrate element so that forces acting on the cable element and/or the substrate element are not guided solely through the solder joint. By embedding the substrate element and the cable element, and possibly the conducting members, into the hotmelt element, the mechanical connection between the substrate element and cable is enforced. Further, the distance between the conducting members is fixed. Cross-talk between the conducting members is reduced. More significantly, the insulation of the conducting members cannot be worn off due to bending loads to the solder joint.

The known electrical components are manufactured by casting the molten hotmelt material indifferently over the substrate element, the solder joint and the cable, in a tool. For this, the components of the electrical component are put into cavities of a tool, in which the hotmelt material is applied.

The hotmelt material may be a thermoplastic material, especially a hotmelt adhesive or hot glue, which, in the hardened state, forms an integral, non-sticky solid body, but in the molten state exhibits cohesive or adhesive properties. It is formed in the hotmelt cavity by supplying molten hotmelt material thereinto.

In the known electrical components, the transmissibility of very high frequencies from the conducting member to the electric member or, generally, from the cable element to the substrate element, decreases significantly at very high frequencies. This is an obstacle in the ongoing drive to use ever higher data transmission rates.

It is therefore an object of the invention to provide an electrical component, as well as a tool and method for manufacturing the same, that is capable of tolerating high mechanical stresses and, at the same time, has an improved performance at very high data rates, say beyond five Gbit/s without leading to increased manufacturing costs.

SUMMARY

This object is achieved according to the invention for an electrical component having the initially recited features in that the at least one solder joint is not embedded in the hotmelt element.

Surprisingly, this solution leads reliably to very high data rates of 5 Gbits/s and beyond. In particular, data transmission rates of 10 gigabit per second can be achieved with not other changes applied to the previously known electric components. It is believed that in the known electrical components, the covering of the solder joints by the hotmelt material has negative implications on the impedance and cross-talk at very high frequencies, which eventually may reduce the achievable data rates.

According to the initially recited method, the object of the invention is achieved by stopping the flow of hotmelt material before it reaches the at least one solder joint.

Finally, for the initially recited tool used for manufacturing the electrical component, the object of the invention is achieved in that the hotmelt cavity is separated from the substrate cavity by an elastically compressible solder sealing.

The solder sealing in operation does not allow the flow of hotmelt to reach the substrate cavity, in which the at least one solder joint is located on the substrate element. Due to its compressibility, the sealing adapts to variations in the shape of the substrate element caused by the inevitable variations in the position of the conducting members and in the shape, position and size of the solder joints. These geometric parameters cannot be maintained exactly constant under economically realistic conditions. The solder sealing adjusts to any of these variations due to its compressibility and does not allow the molten hotmelt material to not cover the solder joints. Due to its elasticity, the solder sealing assumes its original shape as soon as it is no more compressed.

The solution according to the invention may be carried further. In the following, improved embodiments and their advantages are briefly described. The additional features are associated with various advantages and may be arbitrarily combined depending on the need for the respective advantage in a particular application, as becomes clear from the following.

According to a preferred embodiment, the solder joints are not covered by and are in particular free from any hotmelt material from which the hotmelt element is made to further improve the transmission characteristics of the electric component. It appears that even small amounts of hotmelt material on the solder joints affect the maximum data rates through the electrical component.

As another example, the hotmelt element may be formed as a unitary block in order to allow for a simple design of the hotmelt cavity and consequently a simplified flux of the molten hotmelt material within the mold.

In some configurations, the at least one solder joint may not extend up to a rearward end of the substrate element, wherein the rearward end faces in the direction of the hotmelt element or cable element, respectively. Rather, the solder joint may be located at a distance from the rearward end of the substrate element. To avoid, that, in such a case, the conducting member freely bridges the distance between the forward end of the substrate element and the solder joint, the hotmelt element may extend into a space between the at least one conducting member and the substrate element. This stabilizes the conducting member. The hotmelt material may be automatically drawn in this space during the manufacturing process due to capillary forces. Also, the conducting member or the conducting members may be embedded within the hotmelt element up to the solder joint associated with the respective conducting member or members.

In another embodiment, the rearward end of the substrate element may abut the at least one hotmelt element. In this way, the connection between the cable element and the substrate element may be further strengthened, as the abutment limits the movability of the substrate element relative to the hotmelt element.

In order to further improve the connection between the cable element and the substrate element, the rearward end of the substrate element may be bonded to the hotmelt element according to another embodiment. The bonding may be established by cohesive or adhesive forces of the hotmelt material if it comes into contact with the substrate element in the molten state.

Alternatively or additionally to the above measures, the rearward end of the substrate element may extend into and/or be embedded in the hotmelt element. Thus, the contact area between the hotmelt element and the substrate element is increased which leads to higher bonding forces.

In another embodiment, the hotmelt element may extend underneath the substrate element on its lower surface opposite the "upper" surface on which the at least one solder joint is situated, beyond the location of the solder joint. On this surface, the forward end of the hotmelt element may even extend beyond the location of the at least one solder joint on the upper surface. The forward end of the hotmelt element on the upper side, where the solder joint is situated, however, does not extend over the at least one solder joint. This measure increases the surface area of the substrate element that is in contact with the hotmelt material even more. Consequently, the mechanical, strength of the connection between the two is further improved without compromising data transmissibility.

In the method according to the invention, a step of allowing the hotmelt material to flow between the at least one conducting member and the substrate element may be advantageous, as such a step allows to add stability to the conducting members in a region between the rearward end of the substrate element and the solder joint, as explained above.

Furthermore, the method may comprise a step of allowing the hotmelt material to bond to the rearward face of the substrate element. Thus, the connection between the hotmelt element and the substrate element is strengthened.

In another embodiment, the method may comprise a step of allowing the hotmelt material to bond to the lower surface of the substrate element, the lower surface being opposite the upper surface where the at least one solder joint is situated. In this embodiment, the molten hotmelt material or, in the finished product, the hotmelt element extends underneath the substrate element beyond the solder joint.

The method may be carried out by employing a mold, into which the at least one cable element and the at least one substrate element are placed. In this case, the flow of hotmelt is directed into the mold. As is explained with reference to the tool according to the invention, sealings may be used in the mold so that the flow of hotmelt cannot reach the at least one solder joint.

The compressible solder sealing in the inventive tool may, in one preferred instance, be located at least at one of (a) above the location of the at least one solder joint of the substrate element in the tool, which solder joint connects the cable element and the substrate element and (b) between the at least one solder joint and the hotmelt cavity. The solder sealing may be preferably arranged on that side of the tool that faces the solder joint if the parts of the electrical component are placed in their respective cavities.

On the lower side of the cavity, which faces the lower surface of the substrate element preferably without any solder joints, another sealing may be provided. This sealing may be positioned closer to the forward end of the substrate element than the at least one solder sealing, so that the flow of hotmelt material on the lower side of the substrate element may extend beyond the solder joints on the upper side in the forward direction.

In another embodiment, the tool may comprise an elastically compressible cable sealing, the cable sealing separating the cable cavity from the hotmelt cavity. The cable sealing limits the flow of hotmelt in the direction of the cable. The cable sealing may be divided into two parts, which are associated with one half of the tool respectively. Between the two parts, the cable element may be received.

Furthermore, at least one of the solder sealing, lower sealing and cable sealing may be made at least in parts from a silicon material. In the electric, especially electronic industry, the use of silicon is not common, some de facto standards even prohibit the use of silicon or the presence of silicon traces in electrical components. In the present case, however, no disadvantageous results have been observed, although silicon sealings are employed. The use of silicon in the tool according to the invention outweighs any potential drawbacks due to the advantageous thermal stability of silicon and because the hotmelt material advantageously does not bond to the silicon. Furthermore, silicon exhibits the required elastical compressibility and mechanical strength to be used in a high-volume manufacturing processes.

In the following, the electrical component according to the invention, the tool and the method for manufacturing the same are exemplarily described with reference to the accompanying drawings. It is to be understood that this description is of purely exemplary nature and is not meant to limit the invention. In particular, any feature described in the context of the embodiments may be omitted or arbitrarily combined with any other features as has been described above.

DETAILED DESCRIPTION

Figure 1:
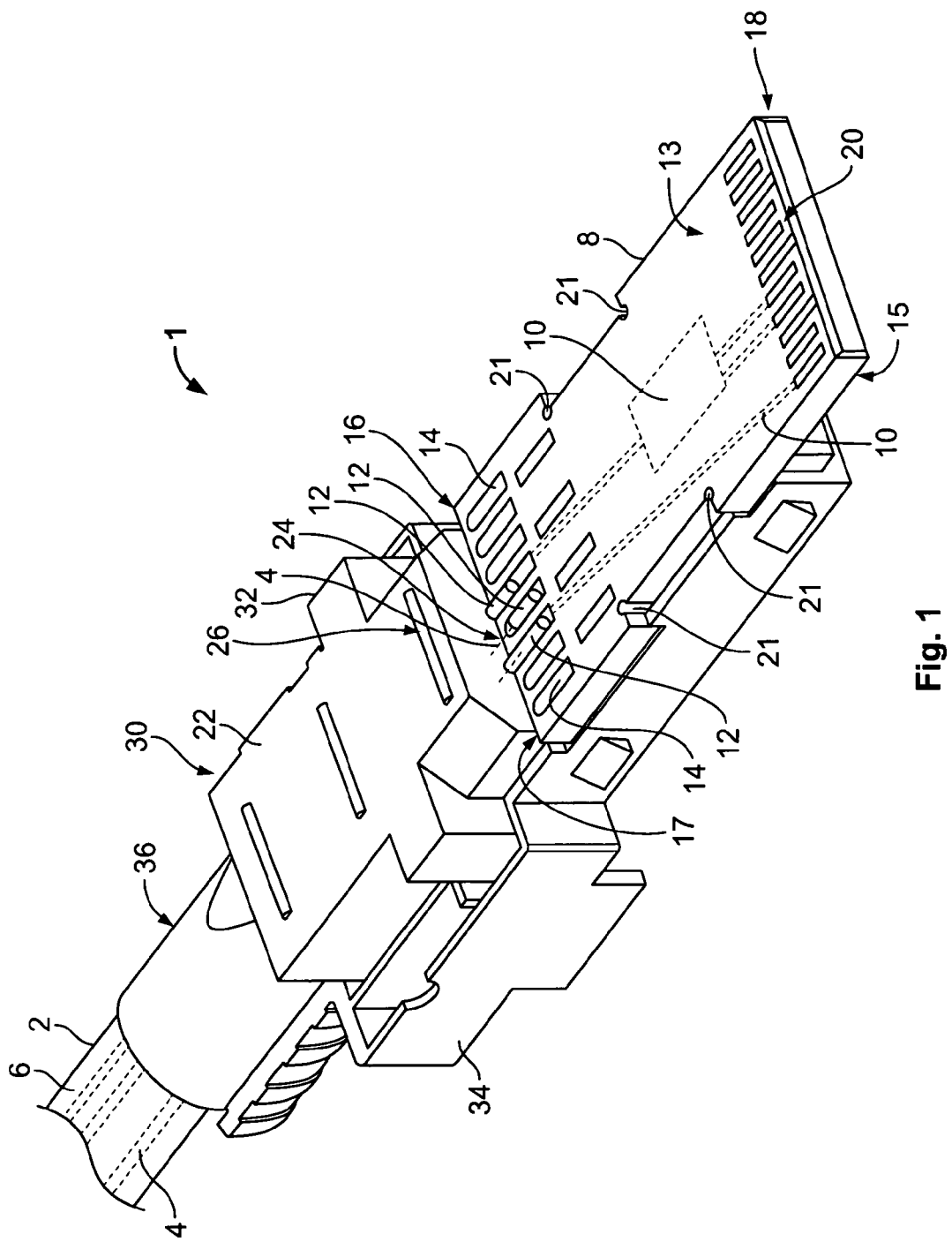
FIG. 1 shows a schematic perspective view of an electrical component according to the invention.

First, the configuration of an electrical component 1 according to the invention is explained with reference to FIG. 1.

The electrical component 1 comprises at least one cable element 2, which in turn comprises at least one conducting member 4 such as a lead of conductive material. Usually, the at least one conducting member is enclosed in an insulation cladding 6, which also surrounds an electromagnetic shield, not shown, to shield off electromagnetic radiation from the conducting members 4.

The cable element 2 is mechanically and electrically connected to a substrate element 8. This connection may take place by connecting the at least one conducting member 4 with at least one electric member 10 of the substrate element, in particular by a solder joint 12 on an upper surface 13 of the substrate element 8. The number of solder joints 12 corresponds to the number of conducting members 4 that are connected to the substrate element 8.

In the following, the "forward" direction designates a direction extending from the cable element 2 to the substrate element 8; the "rearward" direction points from the substrate element 8 to the cable element 2.

The solder joint 12 is created by e.g. placing an end of the conducting member 4 over a solder pad 14 and applying solder material on the solder pad 14 so that the solder material encompasses the end of the conducting member 4 which is exposed after the insulation 6 and the shielding have been peeled away. If the solder material is hardened, it forms a drop-like bump on the substrate element 8 and is bonded both to the conducting member 4 and the solder pad 14. The solder joints 12 in FIG. 1 are all located on the upper surface 13 of the substrate element 8. The number of conducting members 10, solder joints 12 and solder pads 14 shown in FIG. 1 is for illustrative purposes only and may depend on the specific application. Therefore, in the following these expressions are used in the plural form or in conjunction with the expression "at least one". A lower surface 15 of the substrate element 8 may be free of any solder joints.

The solder pad 14 is preferably made of conductive material and constitutes a part of the electric members 10 of the substrate element 8. Other electric members 10, to which the conducting member 4 may be directly or indirectly connected are active or passive, electric or electronic members such as leads, integrated circuits, resistors, transistors, dials and so on and any combination thereof. The electric members 10 are supported by the substrate element 8, which may be a printed circuit board, a rigid or flexible foil equipped with electric members 10, or an injection molded structure, in which the electric members 10 are embedded, and the like.

As can be seen from FIG. 1, the solder joints 12 are of irregular shape and size, and may extend up to a rearward end 16 of the substrate element 8, the rearward end 16 has a rearward face 17 pointing in the direction of the cable element 2. Furthermore, the position of the solder joints 12, and of the conducting members 10 within the solder joints may vary.

A forward end 18 of the substrate element 8 faces away from the cable element 2 and may be provided with a connecting section 20, which allows an electric or electronic connection to other electrical or electronic equipment. In particular, the connecting section 20 may be plugged into a mating connector (not shown) to transmit data at data transmission rates higher than five gigabit per second, preferably higher than ten gigabits per second.

The substrate element 8 may be provided with at least one positioning guide 21, e.g. shaped as an opening at one of the edges, to allow exact positioning during the production of the hotmelt element 22.

The rearward end 16 with its rearward face 17 abuts a hotmelt element 22, which is manufactured from a thermoplastic material, preferably a thermoplastic glue such as a hotmelt or a hot glue. The hotmelt element 22 is interposed between the cable element 2 and the substrate element 8. It surrounds at least one of the cable element 2 and the at least one conducting member 4.

Preferably, a hotmelt material is used for the hotmelt element 22 that exhibits bonding properties in the molten, but not in the solid state, such that the rearward end 16 of the substrate element 8 is cohesively or adhesively bonded to the hotmelt material. From this, a strong mechanical connection between the hotmelt element 22, and the substrate element 8 results.

The hotmelt element may extend into a space 24 between a conducting member 4 and the substrate element 8 up to the solder joint 12, to enforce the part of the conducting member 4 that extends from a forward end 26 of the hotmelt element 22 to the respective solder joint. In another embodiment, this part may be completely embedded in the hotmelt element 22 which extends across the substrate element 8 up to the solder joint 12.

To achieve very high data transmission rates, it is important that the solder joints 12 are not embedded in the hotmelt element 22 and preferably not even covered by the hotmelt material. Thus, the forward end 26 of the hotmelt element 22 is located before the solder joint 12 at least on the upper surface 13. If solder joints 12 are situated on both sides of the substrate element 8, then the forward end 26 of the hotmelt element is located before the solder joints 12 on both sides. The expression "before" refers to the forward direction, i.e. looking from the cable element 2 to the forward end 18 of the substrate element 8.

In the embodiment of FIG. 1, the hotmelt element 22 may be regarded as having two sections of distinct geometric shape, the two sections being, however, part of an integrally cast body: A forward section 30 of the hotmelt element 22 is roughly brick-shaped and may comprise protrusions 32 in order to allow a positive lock and secure positioning in e.g. a housing 34 of which only one lower half is shown in FIG. 1 and into which the integral assembly comprising the cable element 2, hotmelt element 22 and substrate element 8 is put. The other half of the housing (not shown) may be clipped or bonded to the lower half of the housing 34. The housing 34 may further be received in a shielding shell (not shown) made of conductive material, which may be grounded.

A rearward section 36 of the hotmelt element 22 may be of at least roughly cylindrical shape and extend in the forward-rearward direction. The sectional design allows for a decreased rigidity at the entry of the cable element 2 into the hotmelt element 22 relative to the forward section 22. This minimizes shear stresses on the cable element 22 at the transition region between the cable element 2 and the hotmelt element 22.

Figure 2:
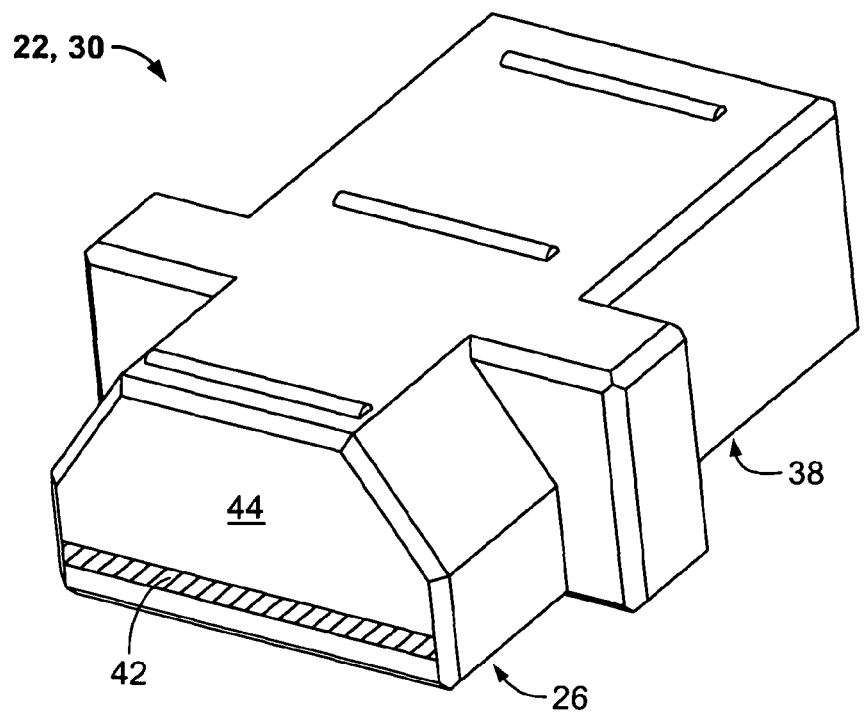
FIG. 2 shows a schematic perspective view of a hotmelt element used in the embodiment of FIG. 1.

FIG. 2 shows the front section 30 of the hotmelt element 22 as used in the embodiment of FIG. 1. A bottom surface 38 of the hotmelt element 22 is substantially planar and aligned and possibly offset with a lower surface 15 (FIG. 1) of the substrate element 8. A bonding region 42, where the substrate element 8 is bonded to a forward face 44 or the forward end 26 of the hotmelt element 22 is shown as a hashed region in FIG. 2. At this location, the rearward end 16 of the substrate element 8 (FIG. 1) may even extend for a short distance into the hotmelt element 22 to increase the bonding effect. However, it is important that the hotmelt element 22 does not reach or cover the solder joints 12, as discussed above.

Figure 3:
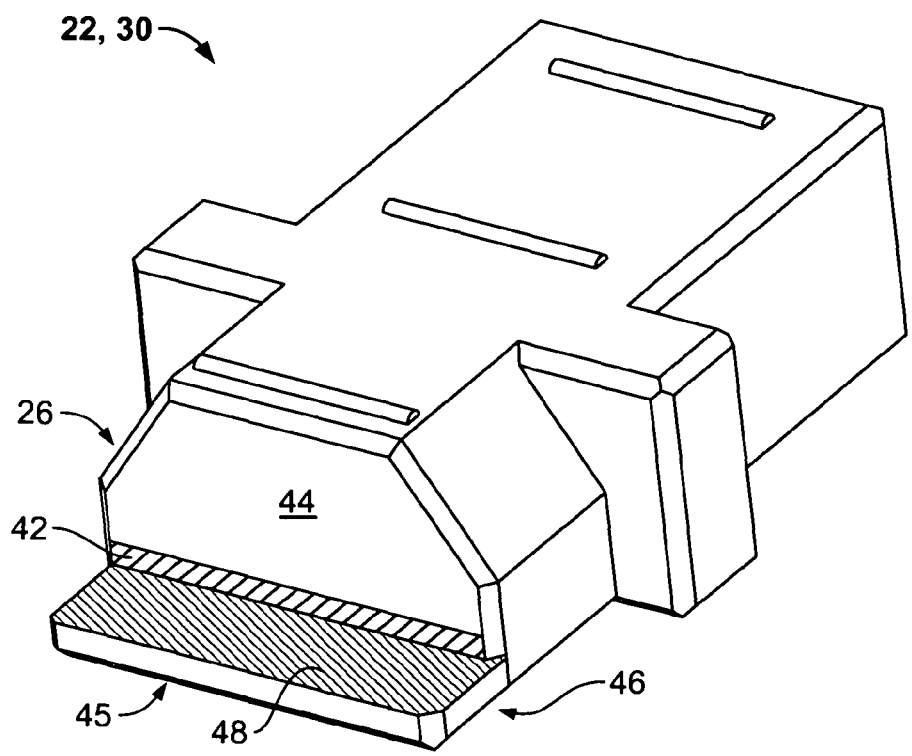
FIG. 3 shows a schematic perspective view of another embodiment of a hotmelt element for an electrical component according to the invention.

FIG. 3 shows another embodiment of the front section 30 of hotmelt element 22. The rearward section 36 may be as described with reference to FIG. 1. The front section 30 of the hotmelt element 22 of FIG. 3 differs from the one shown in FIG. 2 by extending underneath the substrate element 8 along its lower surface 15. If there are no solder joints 12 on the lower surface 15 of the substrate element 8, or if the at least one solder joint 12 on the lower surface 15 is located closer to the forward end 18, a lower forward end 45 of the hotmelt element 22 may even extend beyond the location of the solder joints 12 on the upper surface 15. Thus, the hotmelt element 22 may form a shoulder 46, on which the substrate element 8 rests. This increases significantly the bonding area between the substrate element 8 and the hotmelt element 22. In addition to the bonding region 42 for the rearward face 17 of the substrate element 8, an additional bonding region 48 for a part of the lower surface 15 of the substrate element 8 is available. The bonding regions 42 and 48 are shown as hashed regions in FIG. 3. Again, the rearward end 16 of the substrate element 8 may extend into the hotmelt element 22.

Of course, a shoulder similar to the shoulder 46 may also be provided for the upper surface 13 of the substrate element 8 in addition or alternatively to the shoulder 46, if solder joints 12 are located only on the lower surface 15 for the substrate element 8, or if the solder joints 12 on the upper surface 13 are sufficiently remote from the rearward face 16 of the substrate element 8.

Figure 4:
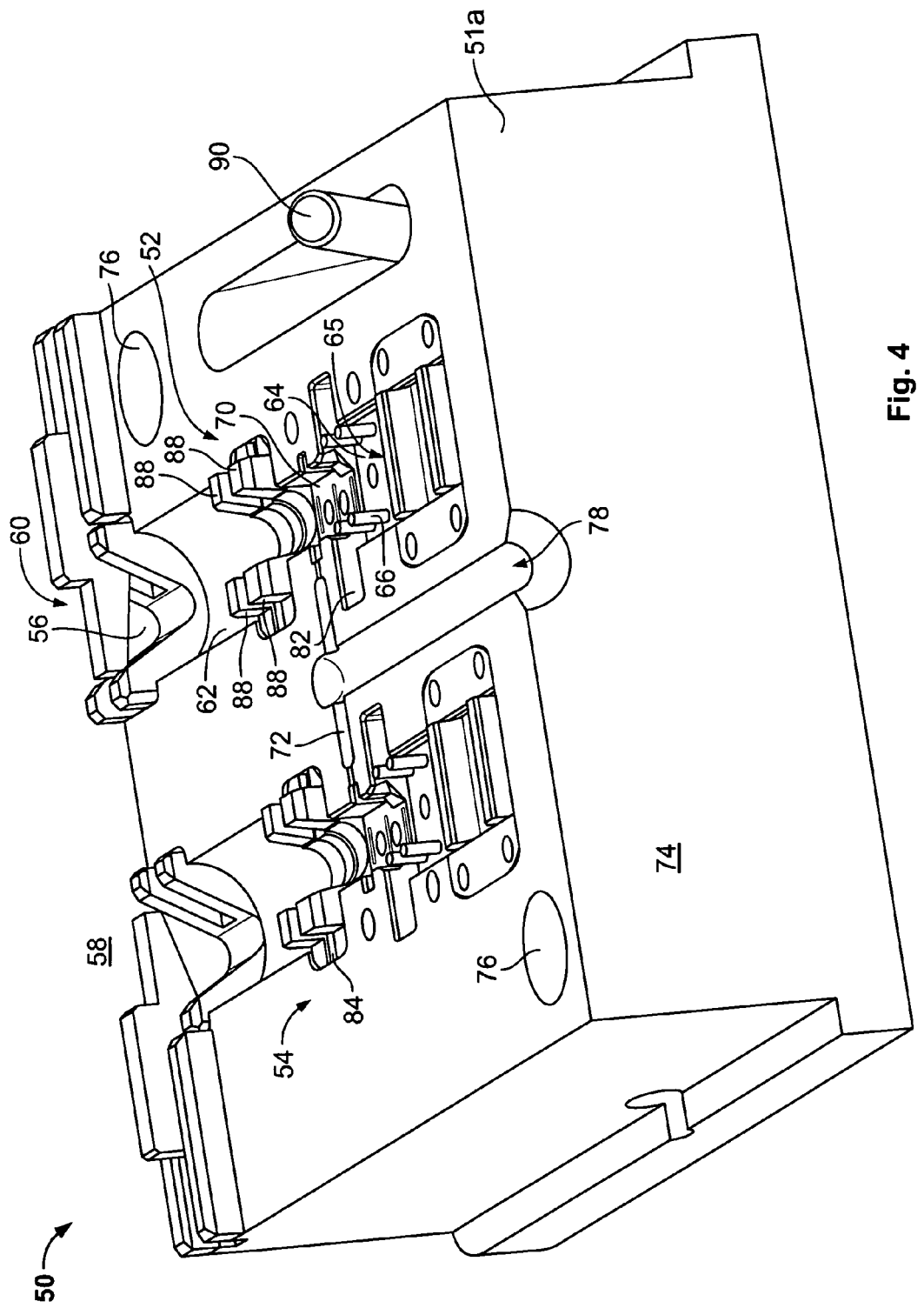
FIG. 4 shows a schematic perspective view of a tool for manufacturing electrical components according to the invention.
Figure 5:
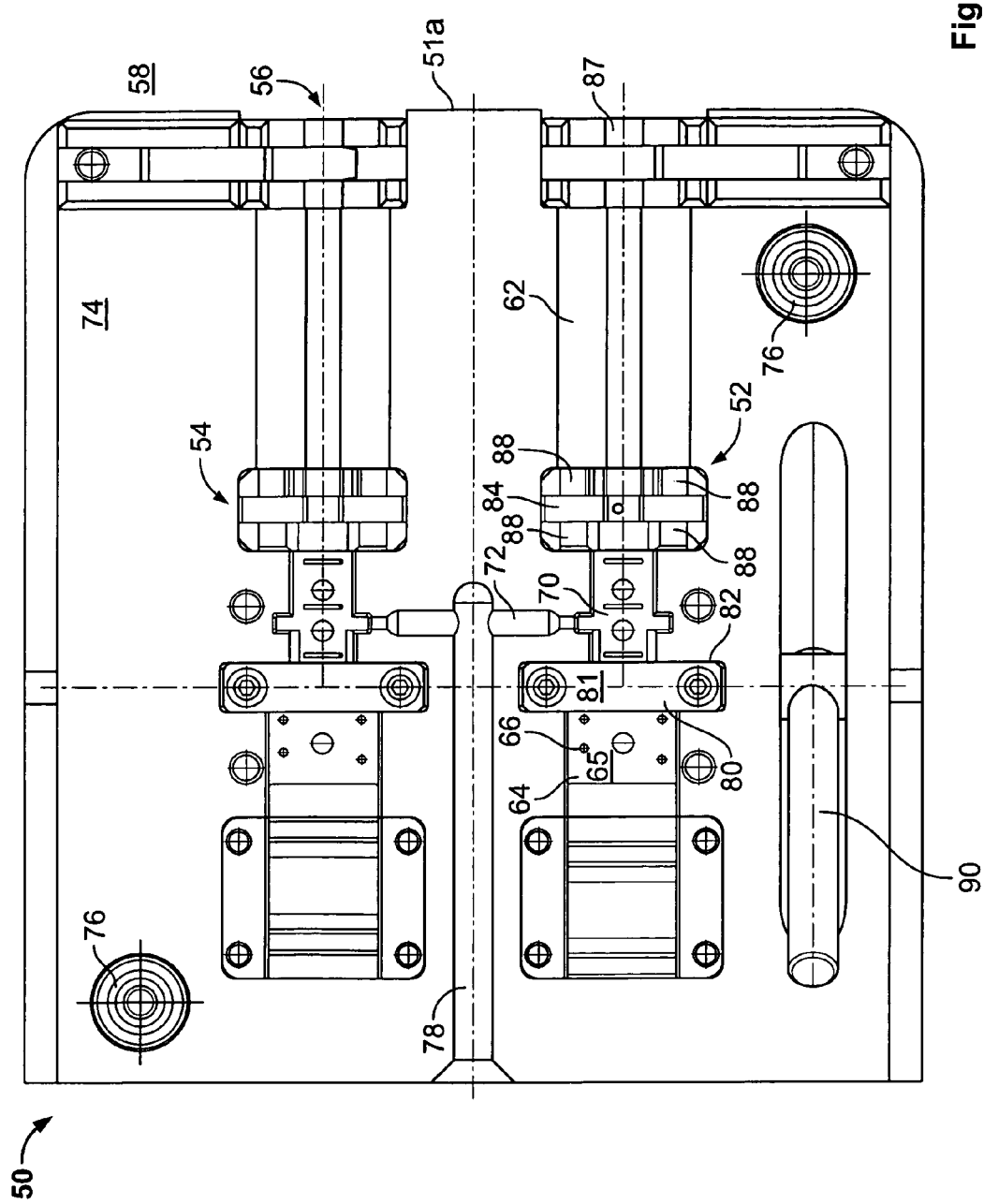
FIG. 5 shows a schematic plan view of the parts shown in FIG. 5.
Figure 6:
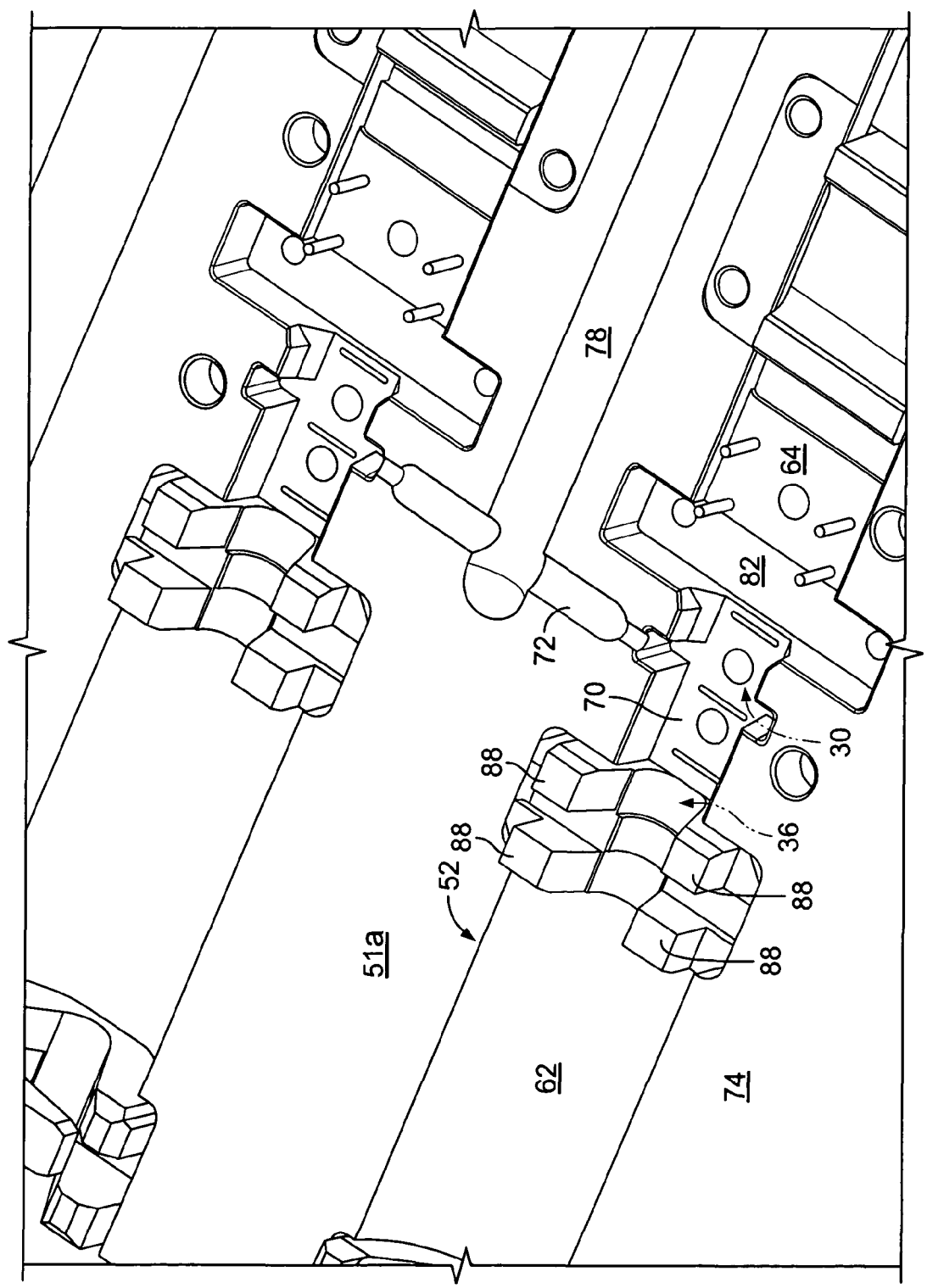
FIG. 6 shows a section of the tool of FIGS. 4 and 5 in a more detailed schematic perspective view.
Figure 7:
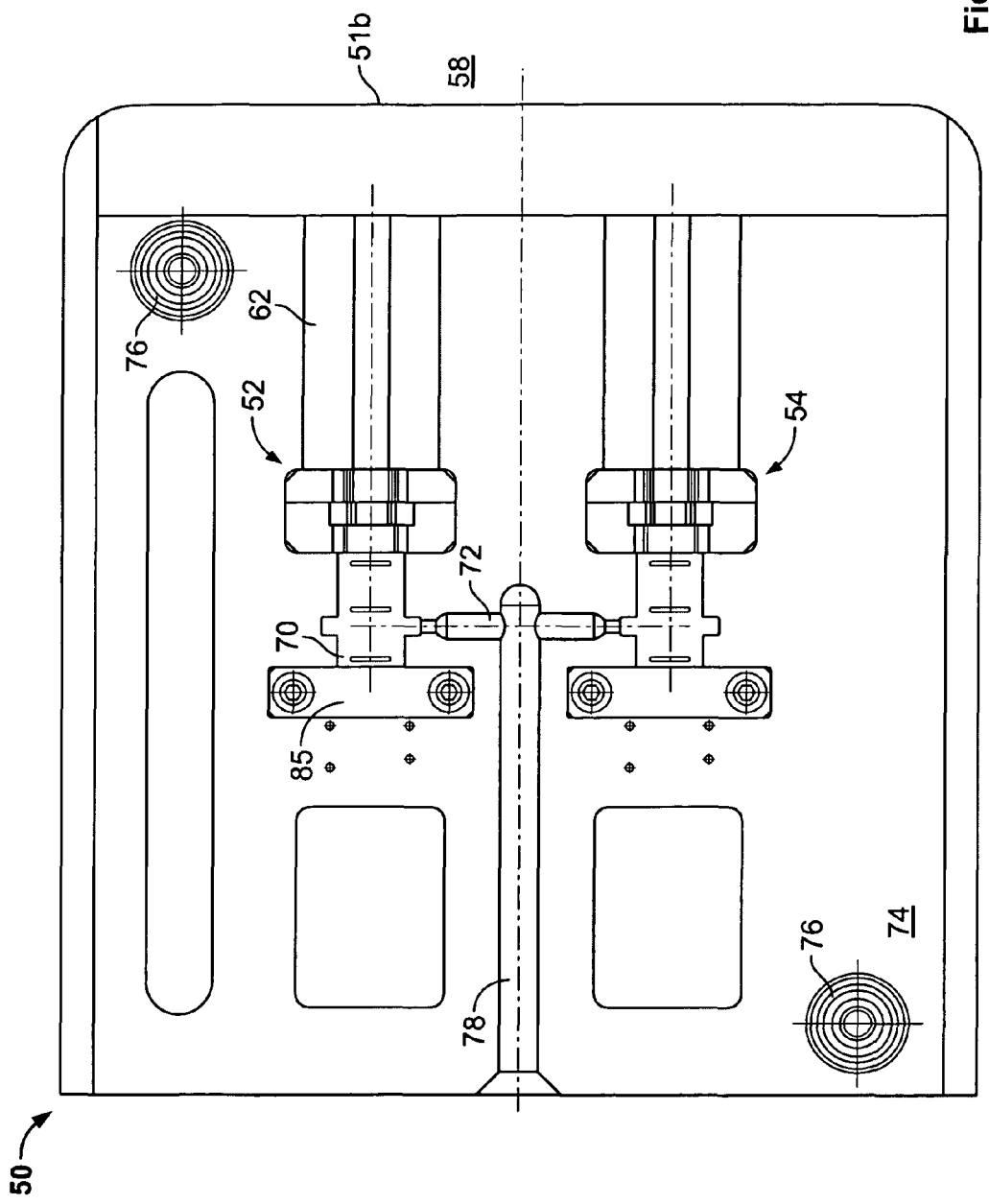
FIG. 7 shows a schematic view of other parts of the tool shown in FIGS. 4 to 6.

The electrical component 1 as shown exemplarily in FIG. 1 may be manufactured with a tool 50, which is described with reference to FIGS. 4 to 7. A lower half 51a of the tool is shown in FIGS. 4 to 6; an upper half 51b of the tool is shown in FIG. 7. In the tool 50, two electrical components 1 may be manufactured at the same time side by side. Two molds for receiving the two electrical components (not shown) in the halves 51a, 51b are indicated with reference numerals 52 and 54, respectively. As the two molds 52, 54 are of identical design and function, only mold 52 will be described.

On the lower half 51a the mold 52 has a cable entrance opening 56 through which the cable element 2 is guided from an outside 58 of the tool into the tool. A clamping device 60 may be provided at or close by the cable entrance opening to fix the position of cable elements of various diameters.

The tool 50 comprises a cable cavity 62 which, at one end, is provided with the cable entrance opening 56.

The tool 50 further comprises at least one substrate cavity 64, which is adapted to receive the substrate element 8 shown in FIG. 1. A bottom 65 of the substrate cavity 64 faces the upper surface 15, or the half of the tool 50 shown in FIGS. 4 and 5. The substrate cavity 64 may be provided with at least one positioning element 62 which interacts with the at least one mating positioning guide 21 (FIG. 1) of the substrate element 8. In the shown embodiments, positioning element 66 in the substrate cavity 64 is a pin, whereas the mating positioning guide 21 is a reception for this pin. As shown, four pins and correspondingly four receptions in a rectangular or trapezoidal arrangement may be used. Of course, any other configuration and number of positioning elements 66 and mating positioning guides 21 may be employed. The positioning element 66 and the mating positioning guide 21 ensure that several substrate elements 8 entering subsequently the tool 50 are located at exactly the same position.

Further, the tool 50 comprises a hotmelt cavity 70, which is arranged between the cable cavity 62 and the substrate cavity 64. Into the hotmelt cavity 70, a supply line 72 opens laterally through which the hotmelt material may be supplied in molten form. To achieve the necessary temperatures, the tool 50 may be manufactured from a substantially massive block 74 of heat-conducting material, such as a metal or a metal alloy, and be provided with heating organs (not shown). Centering elements 76, e.g. centering pins sliding into centering holes, ensure exact alignments of the upper and lower halves 51a, 51b. If the tool 50 is configured to manufacture more than one electrical component 1 at a given time, a central supply line 78 may be present, which branches into several supply lines 72, each opening into the respective hotmelt cavity 70 for the respective mold 52, 54.

The hotmelt cavity 70 is separated from the substrate cavity 64 by an elastically compressible solder sealing 80. The solder sealing 80 may be received in a receptacle 82 formed in the tool 50. In FIG. 6, the receptacle 82 is shown without the solder sealing 80. An e.g. planar sealing surface 81 of the solder sealing 80 faces into the tool 50. The solder sealing 80 comprises silicon material, or, preferably, consists of silicon material. It is located at a position above and/or between the hotmelt cavity 70 and the location of the at least one solder joint 12 of the respective electric component 1 inserted into the tool 50. The position of the at least one solder joint 12 relative to the solder sealing 80 is assured by the positioning element 66 and the mating positioning guide 21.

As, according to the invention, a covering or wetting of the solder joints 12 by the hotmelt material leads to losses in the high-frequency transmission capabilities of the electrical component 1, the flow of hotmelt material through the supply line 72 and into the hotmelt cavity 70 in operation of the tool 50 is stopped before it reaches the solder joints 12. Towards this end, the solder sealing 80 is provided between the hotmelt cavity 70 and the substrate cavity 64. The solder sealing 80 is elastically compressible so that it adapts tightly to the shape variety of the at least one solder joint 12 and the conducting members 4. In operation, the solder sealing 80 is pressed at least against the upper surface 13 of the substrate element 8 and covers the at least one solder joint 12 or at least part of the region between the at least one solder joint 12 and the hotmelt element 22 created in the hotmelt cavity 70.

The upper half 51b of the tool 50, shown in FIG. 7, may be equipped with an additional sealing 83 of substantially similar configuration as the solder sealing 80. In operation, the additional sealing 83 is pressed against the lower surface 15 of the substrate element 8 to create the section 30 of the hotmelt element 22 as described above with reference to FIGS. 2 and 3.

The sealing engagement of the sealings 80, 83 is accomplished e.g. by pressing together the two halves 51a, 51b of the tool 50.

The cable cavity 62 and the hotmelt cavity 70 may be separated by a cable sealing 84 at least on the lower half 51b. The cable sealing 84 may also be made of a material containing silicon, or consist of silicon material. The cable sealing 84 may be positioned adjacent to a cable clamp 85, which fixes the position of the cable element 2 within the tool 50. The cable sealing 84 may be divided into two parts 86a, 86b assigned to the two halves 51a, 51b, each part having a surface 87 facing into the interior of the tool 50 that forms a half-circular opening, which is completed to a circle by the other part of the cable sealing 84 in the other half of tool 50. Thus, the cable sealing surface 87 corresponds to the outer contour of the cable element 2. Of course, the contour of the cable sealing surface 87 may be modified according to the outer contour of the respective cable element 2. The cable sealing 84 is not shown in FIGS. 4 and 6.

FIG. 5 shows the succession of the cable cavity 62, cable sealing 84, hotmelt cavity 70, solder sealing 80, and substrate cavity 64 in greater detail. The shape of the hotmelt cavity 70 resulting in the tool sections 30, 34, indicated in phantom-like arrows, can clearly be seen.

In the vicinity of the cable sealing 84, pin-like protrusions 88 of the cable clamp 85 ensure correct positioning of the cable element 2, which, in operation, is pressed tightly against the shown lower half. The pin-like protrusions 88 are driven into guidance holes of the other half, if the two halves of the tool 50 are joined.

As shown in FIG. 7, a substrate cavity does not need to be provided in the upper half 51b, if the substrate element 8 can be accommodated fully in the lower half 51a. This is of course also true for the other cavities.

The solder joints 12 are most preferably already present, when the hotmelt element 22 is produced. The soldering operation can take place in the tool 50, in which case the cable element 2 and the substrate element 8 are put separately into the tool 50 or mold 52, respectively. It is, however, also possible, to first perform the solder operation at a different station and then put the cable element 2 and the substrate element 8 connected thereto into the tool 50.

An ejection element 90 in the lower half 51a facilitates removal of the completed electrical component 1 after the hotmelt element 22 has been molded and the upper half 51b has been removed.

The invention claimed is:

1. A method for manufacturing an electric component, the electric component including: at least one cable element having at least one conducting member, at least one hotmelt element, and at least one substrate element having at least one electric member; the method comprising the steps of:
   connecting the at least one conducting member to the at lest one electric member by a solder joint;
   applying a flow of molten hotmelt material onto at least one of the cable element and the conducting member in a region adjacent to the substrate element and stopping the flow of hotmelt material before it reaches the solder joint; and
   wherein the step of applying a flow of hotmelt material comprises the step of allowing the hotmelt material to bond to a rearward face of the substrate element, the rearward face facing in the direction of the cable element.

2. A method according to claim 1, wherein the step of applying a flow of hotmelt material comprises the step of allowing the hotmelt material to flow between the conducting member and the substrate element.

3. A method according to claim 1, wherein the step of applying a flow of hotmelt material comprises the step of allowing the hotmelt material to bond to a lower surface of the substrate element, the lower surface being opposite an upper surface of the substrate element, where the at least one solder joint is situated.

4. A method according to claim 1, wherein the method comprises the steps of
   placing the cable element and the substrate element into a mold;
   directing the flow of hotmelt material into the mold.

5. A tool for manufacturing at least one electric component, the tool comprising:
   at least one substrate cavity, the substrate cavity being adapted to receive at least partially at least one substrate element of the electrical component;
   at least one cable cavity, the cable cavity being adapted to receive at least one cable element of the electrical component;
   at least one hotmelt cavity, the hotmelt cavity being located between the cable cavity and the substrate cavity and being adapted to be supplied with molten hotmelt material,
   wherein the hotmelt cavity is separated from the substrate cavity by an elastically compressible solder sealing.

6. A tool according to claim 5, wherein the solder sealing is located at least at one of (a) above the location of the at least one solder joint, the solder joint connecting the cable element and the substrate element, and (b) between the at least one solder joint and the hotmelt cavity.

7. A tool according to claim 5, wherein the tool comprises at least one cable entrance opening and an elastically compressible cable sealing, the cable entrance opening being adapted to guide the cable element from outside the tool into the cable cavity, the cable sealing separating the cable entrance opening from the cable cavity.

8. A tool according to claim 5, wherein at least one of the solder sealing and the cable sealing are made at least in part from a silicon material.

* * * * *